United States Patent [19]
Daum et al.

[11] Patent Number: 4,669,798

[45] Date of Patent: Jun. 2, 1987

[54] ELECTRICAL TERMINAL FOR FLEXIBLE PRINTED CIRCUITS

[75] Inventors: Ronald E. Daum, Warren; Gary C. Detter, Berlin Center; Andrew M. Spisak, Youngstown, all of Ohio

[73] Assignee: General Motors Corporation, Detroit, Mich.

[21] Appl. No.: 817,449

[22] Filed: Jan. 9, 1986

[51] Int. Cl.[4] ............................................. H01R 4/24
[52] U.S. Cl. .................................... 439/423; 439/877
[58] Field of Search ............. 339/97 C, 276 R, 276 T

[56] References Cited

U.S. PATENT DOCUMENTS 3,182,282  5/1965  Turner ............................... 339/97 C
4,082,402  4/1978  Kinkaid et al. ..................... 339/97 C Primary Examiner—Joseph H. McGlynn
Attorney, Agent, or Firm—F. J. Fodale

[57] ABSTRACT

An electrical terminal is attached to a flexible printed circuit by an attachment means which is in the form of a crimp ferrule which comprises an elongated web which has a plurality of raised convex domes which cooperate with sets of crimp tabs integrally attached at the longitudinal sides of the elongated web. These raised convex domes are set in a pattern with respect to the crimp tabs so that the flexible printed circuit is forced to weave through the crimp ferrule when the crimp tabs are curled or crimped over the flexible printed circuit. This establishes several good and stable electrical contacts between the flexible printed circuit and the crimp ferrule and forces the flexible printed circuit to weave through the attached crimp ferrule to provide a strain relief for the several electrical contacts.

7 Claims, 13 Drawing Figures

ELECTRICAL TERMINAL FOR FLEXIBLE PRINTED CIRCUITS

This invention relates generally to electrical terminals and more particularly to electrical terminals having means for attaching the electrical terminal to a flexible printed circuit in the form of a crimp ferrule.

It is already known to provide an electrical terminal having means for attaching the terminal to a flexible printed circuit in the form of a crimp ferrule which comprises an elongated web having sharp teeth or crimp tabs integrally attached at the longitudinal sides of the elongated web. The teeth or crimp tabs extend through the flexible printed circuit and are curled or crimped over to press the flexible printed circuit against the elongated web so as to attach the terminal to the flexible printed circuit. These teeth or crimp tabs also usually pierce the insulation of the flexible printed circuit in one way or another to make electrical contact with the conductive copper strip of the flexible printed circuit. It is also known that the elongated web may include structure, such as a rosette, a lance or lances, a raised elongated projection, or a raised and grooved channel, to enhance the electrical contact between the crimp ferrule and the flexible printed circuit in one way or another.

The object of this invention is to provide an improved attachment means for electrical terminals in which the attachment means is in the form of a crimp ferrule in which the elongated web has a plurality of raised convex domes which cooperate with the crimp tabs integrally attached at the longitudinal sides of the elongated web. These raised convex domes are set in a pattern with respect to the crimp tabs so that the flexible printed circuit is forced to weave through the crimp ferrule when the crimp tabs are curled or crimped over the flexible printed circuit The raised convex domes and crimped over tabs then provide concentrated forces acting on the flexible printed circuit which bow or deform the conductive copper strip of the flexible printed circuit over each raised convex dome. This establishes several good and stable electrical contacts between the flexible printed circuit and the crimp ferrule and forces the flexible printed circuit to weave through the attached crimp ferrule to provide a strain relief for the several electrical contacts.

Other objects and features of the invention will become apparent to those skilled in the art as the disclosure is made in the following detailed description of a preferred embodiment of the invention as illustrated in the accompanying sheets of drawing in which:

FIG. 1 is a plan view of an electrical terminal having a crimp ferrule in accordance with a first embodiment of the invention.

FIG. 2 is a longitudinal section of the crimp ferrule taken substantially along the line 2—2 of FIG. 1 looking in the direction of the arrows.

FIG. 3 is a side view of the terminal shown in FIG. 1.

FIG. 4 is a transverse section taken substantially along the line 4—4 of FIG. 3 looking in the direction of the arrows.

FIG. 5 is a longitudinal section similar FIG. 2 showing the crimp ferrule attached to a flexible printed circuit.

FIGS. 6 and 7 are transverse sections similar to FIG. 4 showing the crimp ferrule in the process of being attached to a flexible printed circuit.

Figure 8:
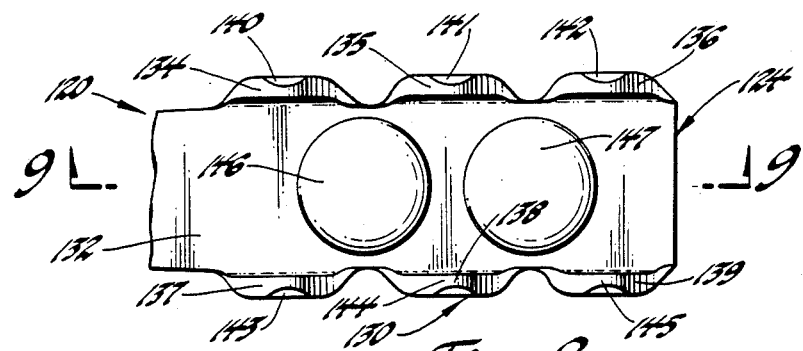

FIG. 8. is a plan view of an electrical terminal having a crimp ferrule in accordance with a second embodiment of the invention.

Figure 9:
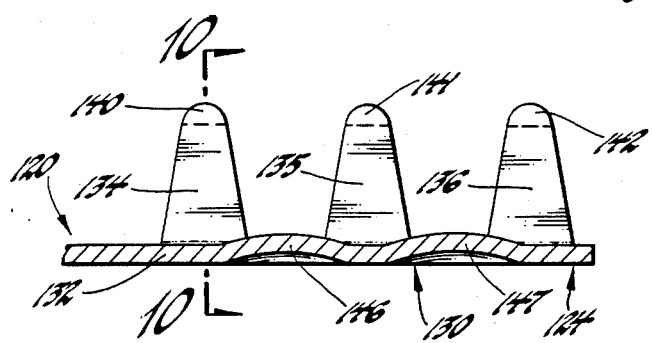

FIG. 9 is a longitudinal section of the crimp ferrule taken substantially along the line 9—9 of FIG. 8 looking in the direction of the arrows.

Figure 10:
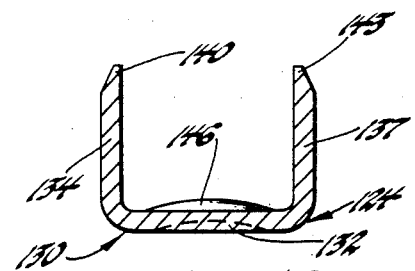

FIG. 10 is a transverse section taken substantially along the line 10—10 of FIG. 9 looking in the direction of the arrows.

Figure 11:
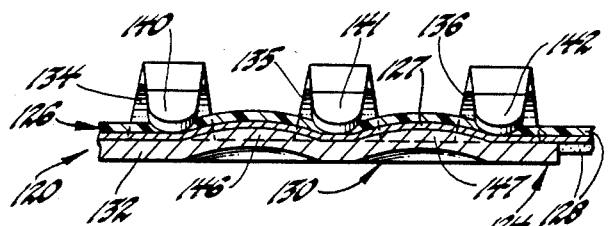

FIG. 11 is a longitudinal section similar to FIG. 9 showing the crimp ferrule attached to a flexible printed circuit.

Figure 12:
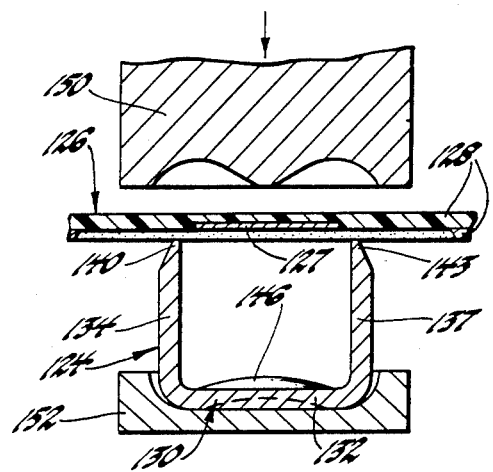
Figure 13:
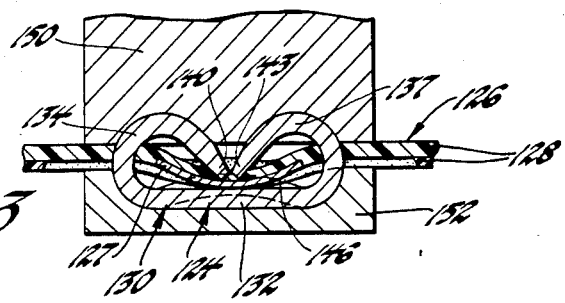

FIGS. 12 and 13 are section views similar to FIG. 10 showing the crimp ferrule in the process of being attached to a flexible printed circuit.

Referring now to the drawing and, more particularly, to FIGS. 1-7, a first embodiment of the invention is illustrated in connection with a female electrical terminal 20 having a female socket contact 22 at one end and an attachment means 24 at the other end for attaching the electrical terminal 20 to a flexible printed circuit 26.

The attachment means 24 is in the form of a crimp ferrule 30 which comprises an elongated web 32 having a first set of longitudinally spaced teeth or crimp tabs 34, 35 integrally attached at one longitudinal side of the elongated web 32 and a second set of longitudinally spaced teeth or crimp tabs 36, 37 integrally attached at the opposite longitudinal side of the elongated web 32. The first set of crimp tabs 34, 35 are staggered with respect to the second set of crimp tabs 36, 37 in the longitudinal direction. The crimp tabs 34, 35 and 36, 37 of each set of crimp tabs are longitudinally spaced so that the tip 38 of the crimp tab 34 fits between the tips 40 and 41 of the crimp tabs 36 and 37 of the opposite set when the crimp tabs are crimped over. The tip 41 similarly fits between the tips 38 and 39 of the crimp tabs 34 and 35.

The tips 38, 39, 40 and 41 of the crimp tabs 34, 35, 36 and 37 are rounded as shown in FIGS. 1, 2 and 3 and coined as shown in FIGS. 1 and 4. Furthermore the tips 38, 39, 40 and 41 and edges of the crimp tabs 34, 35, 36 and 37 are sharp so that the crimp tabs 34, 35, 36 and 37 penetrate through the conductive copper strip and insulation of the flexible printed circuit 26 when the crimp ferrule 30 is attached as shown in FIG. 7.

The elongated web 32 has three raised convex domes 42, 44 and 46. The domes are longitudinally spaced along the centerline of the elongated web 32 as shown in FIG. 1 and substantially hemispherical in cross section as shown in FIG. 2. The center of the forward dome 42 lies on the centerline of the elongated web 32 between the tips 38 and 40 of the forward diagonally related pair of crimp tabs 34 and 36 in the longitudinal direction. The middle dome 44 is similarly centered between the tips 38 and 41 of the diagonally related forward crimp tab 34 and rearward crimp tab 37. The rearward dome 46 is centered between the tips 39 and 41 of the rearward diagonally related pair crimp tabs 35 and 37. Consequently, when the crimp tabs 34, 35, 36 and 37 are crimped over, the flexible printed circuit 26 is pushed against each dome by a pair of diagonally related, crimped over tabs which are on opposite sides of the dome in the longitudinal direction of the elongated web 32 as shown in FIG. 5 and which extend from opposite longitudinal sides of the elongated web 32 past the dome in the transverse direction as shown in FIG. 7. These crimped over tabs bow or deform the conductive strip over each dome in the longitudinal direction as shown in FIG. 5 as well as in the transverse direction as shown in FIG. 7. Moreover, the flexible printed circuit 26 is forced to weave through the attached crimp ferrule 30 as best shown in FIG. 5. Thus, the crimped over tabs 34, 35, 36 and 37 and raised convex domes 42, 44 and 46 establish several good electrical contacts between the conductive copper strip of the flexible printed circuit 26 and the elongated web 32 as well as provide a strain relief which maintains the several established electrical contacts.

The flexible printed circuit 26, as is well known in the art, comprises a thin conductive strip 27 of copper or the like which are sandwiched between two Mylar insulation sheets 28 bonded together to encapsulate the conductive strip. Such a flexible printed circuit is prepared for attachment to the crimp ferrule 32 of the invention by removing a portion of one of the Mylar insulation sheets 28 so that the surface of the conductive copper strip 27 is exposed at one end as shown in FIG. 6. The flexible printed circuit 26 is then placed over the crimp ferrule 30 in a crimping die 50, 52. The flexible printed circuit 26 is oriented on the crimp tabs 34, 35, 36 and 37 so that the exposed surface of the conductive copper strip 27 faces the raised convex domes 42, 44 and 46 of the elongated web 32 as shown in FIG. 6. The tips of the crimp tabs 34, 35, 36 and 37 may also engage the longitudinal edges of the conductive copper strip 27 as shown in FIG. 6 but this is not absolutely necessary as either or both longitudinal edges of the conductive copper strip 27 may lie inside the associated set of crimp tabs.

After the flexible printed circuit is placed over the crimp ferrule 30, the crimping die 50, 52 is closed as shown in FIG. 7. During closure, the crimp tabs 34, 35, 36 and 37 are forced through the conductive copper strip 27 and Mylar insulation sheet 28 by the upper die part 50 which curls the crimp tabs 34, 35, 36 and 37 inwardly and downwardly toward the elongated web 32 so that the crimp tabs 34, 35, 36 and 37 are crimped over the flexible printed circuit 26 and press the conductive copper strip 27 against the raised domes 42, 44 and 46 as described above.

The surface of the web 32 including the convex surfaces of the raised domes 42, 44 and 46 is preferably knurled (not shown). This is a well known technique for improving electrical conductivity at the interface.

The flexible printed circuit 26 may have several conductive copper strips and several terminals may be attached simultaneously by a suitably designed die.

Referring now to FIGS. 8-13, a second embodiment of the invention is illustrated in connection with an electrical terminal 120 having an attachment means 124 at one end for attaching the electrical terminal 120 to a flexible printed circuit 126.

The attachment means 124 is also in the form of a crimp ferrule 130 which comprises an elongated web 132 having a first set of longitudinally spaced teeth or crimp tabs 134, 135 and 136 integrally attached at one longitudinal side of the elongated web 132 and a second set of longitudinally spaced teeth or crimp tabs 137, 138 and 139 integrally attached at the opposite longitudinal side of the elongated web 132. The first set of crimp tabs 134, 135 and 136, however, are aligned with respect to the second set of crimp tabs 137, 138 and 139 in the longitudinal direction. The crimp tabs 134, 135, 136, 137, 138 and 139 have tips 140, 141, 142, 143, 144 and 145 respectively, which are rounded as shown in FIGS. 8 and 9 and coined as shown in FIGS. 8 and 10. Furthermore the tips 140, 141, 142, 143, 144 and 145 and edges of the crimp tabs 134, 135, 136, 137, 138 and 139 are sharp so that the crimp tabs can penetrate through the conductive copper strip and insulation of the flexible printed circuit 126 when the crimp ferrule 130 is attached as shown in FIG. 13.

The elongated web 132 has two raised convex domes 146 and 147. The domes are longitudinally spaced along the centerline of the elongated web 132 as shown in FIG. 8 and partispherical in cross section as shown in FIGS. 9 and 10. The center of the forward dome 146 lies on the centerline of the elongated web 132 at a location which is between the tips 140 and 143 of the forward crimp tabs 134 and 137 and the tips 141 and 144 of the middle crimp tabs 135 and 138 in the longitudinal direction. The rearward dome 147 is similarly centered between the tips 141 and 144 of the middle crimp tabs 135 and 138 and the tips 142 and 145 of the rearward crimp tabs 136 and 139 in the longitudinal direction. Consequently, when the six crimp tabs are crimped over, the flexible printed circuit 126 is pushed against each dome by two diagonally related pairs of crimped over tabs 134, 138; and 135 and 137 in which each pair are on opposite sides of the dome 146 in the longitudinal direction of the elongated web 132 and in which each pair extend from opposite longitudinal sides of the elongated web 132 toward the dome 146 in the transverse direction engaging the flexible printed circuit 126 just short of the center plane in which the center of the dome lies as shown in FIG. 13. These crimped over tabs also bow or deform the conductive strip over each dome 146, 147 in the longitudinal direction as shown in FIG. 11 as well as in the transverse direction as shown in FIG. 13. Moreover, the flexible printed circuit 126 is forced to weave through the attached crimp ferrule 130 as best shown in FIG. 11. Thus, the crimped over tabs 134, 135, 136, 137, 138, and 139 and the raised convex domes 146 and 147 also establish several good electrical contacts between the conductive copper strip of the flexible printed circuit 126 and the elongated web 132 as well as provide a strain relief which maintains the several established electrical contacts.

As before, the flexible printed circuit 126 is prepared for attachment to the crimp ferrule 132 by removing a portion of one of the Mylar insulation sheets 128 so that the surface of the conductive copper strip 127 is exposed at one end as shown in FIG. 12. The flexible printed circuit 126 is then placed over the crimp ferrule 130 in a crimping die 150, 152. The flexible printed circuit 126 is oriented on the six crimp tabs 134-139 so that the exposed surface of the conductive copper strip 127 faces the raised convex domes 146 and 147 of the elongated web 132 as shown in FIG. 12. The tips of the crimp tabs also may engage the longitudinal edges of the conductive copper strip 127 as shown in FIG. 13 but this is not absolutely necessary as either or both longitudinal edges of the conductive copper strip 127 may lie inside the associated set of crimp tabs as shown in FIG. 12.

After the flexible printed circuit 126 is placed over the crimp ferrule 130, the crimping die 150, 152 is closed as shown in FIG. 13. During closure, the six crimp tabs 134-139 are forced through the Mylar insulation sheet 128 on either side of the conductive copper strip 127 by the upper die part 150 which curls the crimp tabs 134-139 inwardly and downwardly toward the elongated web 132 so that the crimp tabs 134-139 are crimped over the flexible printed circuit 126 and press the conductive copper strip 127 against the raised domes 146 and 147 as described above. As before, the surface of the web 132 including the convex surfaces of the raised domes 146 and 147 is preferably knurled (not shown). Several terminals may be simultaneously attached to a flexible printed circuit having several conductive strips by a suitable die.

The embodiments of the invention in which an exclusive property or privilege is claimed are defined as follows:

1. An electrical terminal having means for attaching the terminal to a flexible printed circuit which comprise a crimp ferrule having an elongated web, a first set of crimp tabs integrally attached at one longitudinal side of the elongated web and a second set of crimp tabs integrally attached at the opposite longitudinal side of the elongated web characterized in that:

the web has a plurality of raised convex domes which are located on the centerline of the web and longitudinally spaced from each other, and the raised convex domes include a first dome which has a center which lies between a tip of a first crimp tab of the first set of crimp tabs and a tip of a first crimp tab of the second set of crimp tabs in the longitudinal direction so that a flexible printed circuit atop the domes is pushed against the first dome by the first said crimp tabs which are on opposite sides of the first dome in the longitudinal direction and which extend from opposite longitudinal sides of the web toward the first dome in the transverse direction when the first said crimp tabs are crimped over.

2. The electrical terminal as defined in claim 1 wherein the raised convex domes include a second dome which has a center which lies between a tip of a second crimp tab of the first set of crimp tabs and a tip of a second crimp tab of the second set of crimp tabs in the longitudinal direction so that the flexible printed circuit atop the domes is pushed against the second dome by the second said crimp tabs which are on opposite sides of the second dome in the longitudinal direction and which extend from opposite longitudinal sides of the web toward the second dome in the transverse direction when the second said crimp tabs are crimped over.

3. The electrical terminal as defined in claim 2 wherein the set of crimp tabs integrally attached at one longitudinal side of the elongated web are staggered with respect to the set of crimp tabs integrally attached at the opposite longitudinal side of the elongated web and the first said crimp tabs extend past the center of the first dome and the second said crimp tabs extend past the second dome when the first and second said crimp tabs are crimped over.

4. The electrical terminal as defined in claim 2 wherein the set of crimp tabs integrally attached at one longitudinal side of the elongated web are longitudinally aligned with respect to the set of crimp tabs integrally attached at the opposite longitudinal side of the elongated web.

5. An electrical terminal having means for attaching the terminal to a flexible printed circuit which comprise a crimp ferrule having an elongated web, a first set of crimp tabs integrally attached at one longitudinal side of the elongated web and a second set of crimp tabs integrally attached at the opposite longitudinal side of the elongated web characterized in that:

the web has a plurality of raised convex domes which are located on the centerline of the web and longitudinally spaced from each other, and each said dome has a center which lies between a tip of a crimp tab of the first pair of crimp tabs and a tip of a crimp tab of the second pair of crimp tabs so that a flexible printed circuit atop the domes is pushed against each said dome by a pair of diagonally related crimp tabs which are on opposite sides of the dome and which extend inwardly toward the dome from opposite longitudinal sides of the web when the aforesaid crimp tabs are crimped over so that the flexible printed circuit weaves through the crimp ferrule in the longitudinal direction.

6. The electrical terminal as defined in claim 5 wherein the elongated web has three domes, wherein the set of crimp tabs integrally attached at one longitudinal side of the elongated web are staggered with respect to the set of crimp tabs integrally attached at the opposite longitudinal side of the elongated web, and wherein each of the crimp tabs extends past the center of its associated dome when the crimp tabs are crimped over.

7. The electrical terminal as defined in claim 5 wherein the elongated web has two domes, wherein the set of crimp tabs integrally attached at one longitudinal side of the elongated web are longitudinally aligned with respect to the set of crimp tabs integrally attached at the opposite longitudinal side of the elongated web, and wherein the flexible printed circuit is pushed against each said dome by a second pair of diagonally related crimp tabs.

* * * * *